United States Patent
Hashimoto et al.

(10) Patent No.: US 7,458,415 B2
(45) Date of Patent: *Dec. 2, 2008

(54) COOLING APPARATUS AND ELECTRONIC EQUIPMENT

(75) Inventors: Toshio Hashimoto, Tokyo (JP); Toru Kimura, Tokyo (JP); Sachiko Kaneko, Chiba (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/440,556

(22) Filed: May 25, 2006

(65) Prior Publication Data

US 2006/0207748 A1 Sep. 21, 2006

Related U.S. Application Data

(63) Continuation of application No. 10/938,193, filed on Sep. 10, 2004, now Pat. No. 7,051,791.

(30) Foreign Application Priority Data

Sep. 16, 2003 (JP) ............................. 2003-323318

(51) Int. Cl.
*F28F 7/00* (2006.01)
*F28D 15/00* (2006.01)
*F24H 3/06* (2006.01)
*H05K 7/00* (2006.01)

(52) U.S. Cl. ............ 165/80.3; 165/104.21; 165/104.34; 165/122

(58) Field of Classification Search .................. 165/121, 165/122, 126, 104.33, 104.34, 80.3; 361/695, 361/697–700; 415/201, 203, 206; 417/423.8, 417/313
See application file for complete search history.

(56) References Cited

U.S. PATENT DOCUMENTS

| 5,409,352 | A | 4/1995 | Lin |
| 5,431,216 | A | 7/1995 | Ogushi et al. |
| 6,309,190 | B1 * | 10/2001 | Chen ........................ 417/423.1 |
| 6,457,955 | B1 | 10/2002 | Cheng |
| 6,652,225 | B2 | 11/2003 | Esa |
| 6,659,169 | B1 * | 12/2003 | Lopatinsky et al. ......... 165/121 |
| 6,698,505 | B2 | 3/2004 | Lopatinsky et al. |
| 6,752,201 | B2 | 6/2004 | Cipolla et al. |
| 6,867,971 | B2 * | 3/2005 | Lai ............................ 361/697 |
| 7,051,791 | B2 * | 5/2006 | Hashimoto et al. ......... 165/80.3 |

(Continued)

FOREIGN PATENT DOCUMENTS

JP 11-097873 4/1999

(Continued)

*Primary Examiner*—Tho v Duong
(74) *Attorney, Agent, or Firm*—Rockey, Depke & Lyons, LLC; Robert J. Depke

(57) ABSTRACT

The rotation of axial-flow blades permits air entered through an inlet port to exit directly to outside of a case in the axial direction, and the rotation of centrifugal blades permits air entered through the inlet port to exit through a side surface outlet port to the outside of the case in the centrifugal direction. Accordingly, the amount of flow of air exiting from inside of the case can be increased so that the amount of heat dissipation is increased. It is therefore able to provide a cooling apparatus and electronic equipment mounting the cooling apparatus with improved cooling efficiency while achieving a small thickness.

10 Claims, 8 Drawing Sheets

U.S. PATENT DOCUMENTS

| | | | |
|---|---|---|---|
| 2002/0090308 A1 * | 7/2002 | Cheng | 417/423.1 |
| 2003/0066627 A1 | 4/2003 | Lin et al. | |
| 2003/0161102 A1 * | 8/2003 | Lee et al. | 361/687 |
| 2004/0114328 A1 | 6/2004 | Chiou | |
| 2004/0197192 A1 * | 10/2004 | Jarrah et al. | 416/206 |
| 2004/0201958 A1 * | 10/2004 | Lev | 361/687 |

FOREIGN PATENT DOCUMENTS

| | | |
|---|---|---|
| JP | 2001-119183 | 4/2001 |
| JP | 2001-217366 | 8/2001 |
| JP | 2001-271793 | 10/2001 |
| JP | 2001-318738 | 11/2001 |
| JP | 2002-139283 | 5/2002 |
| JP | 2003-101272 | 4/2003 |
| JP | 2003-258473 | 9/2003 |
| JP | 2004-039861 | 2/2004 |
| WO | WO 03/067949 A1 | 8/2003 |

* cited by examiner

COOLING APPARATUS AND ELECTRONIC EQUIPMENT

The subject matter of application Ser. No. 10/938,193 is incorporated herein by reference. The present application is a continuation of U.S. Ser. No. 10/938,193, filed Sep. 10, 2004 now U.S. Pat. No. 7,051,791, which claims priority to Japanese Patent Application No. JP 2003-323318 filed Sep. 16, 2003, both of which applications are incorporated herein by reference.

CROSS REFERENCE TO RELATED APPLICATIONS

The present document is based on Japanese Priority Document JP2003-323318, filed in the Japanese Patent Office on Sep. 16, 2003, the entire contents of which being incorporated herein by reference.

BACKGROUND OF THE INVENTION

1. Field of the Invention

The present invention relates to a cooling apparatus for cooling such as electronic equipment, and to electronic equipment mounting the same.

2. Description of Related Art

As means for cooling an electronic component that generates heat, such as a central processing unit (CPU) mounted on a computer, a blower with a fan and a heat pipe have hitherto been used. There is also an apparatus-made by combining such a blower and such a heat pipe (for example, see a patent document 1: Japanese Patent Application Publication No. 2003-92483 (Paragraphs [0026] and [0027], FIG. 2, FIG. 4 and FIG. 5)).

In the apparatus, a fan unit 38 is disposed such that air is sent to fins 31 connected to a radiating part side of a heat pipe 29. Specifically, intake ports 42 and 47 are disposed at a fan case 39 of the fan unit 38 and a printed circuit board 19, respectively, and a wall surrounding the fan is formed by both of the fan case 39 and the printed circuit board 19. External air is introduced through both of the intake ports 42 and 47, and the air is fed to the fins 31 arranged in the centrifugal direction. By this construction, the wiring and the like of the printed circuit board 19 are also cooled and air intake from both directions is performed to increase cooling efficiency.

SUMMARY OF THE INVENTION

Meanwhile, in the recent years, the heating value generated from a heat-generating element is on the increase due to higher clock in operation frequency. Therefore, under this circumstance, cooling processing has a limitation even if air is taken from both directions by the fan, as in the invention described in the above-mentioned patent document 1. In order to increase cooling efficiency, to enlarge a radiating plate of a fin and to increase the number thereof are unsuitable for thinning the apparatus because it is necessary to conserve space for installing the fins. Further, not only to combine a heat pipe and a fan unit, it is also desirable, for example, that the position at which the heat pipe is disposed relative to the fan unit is optimized in terms of heat efficiency.

In view of the foregoing circumstances, this invention provides a cooling apparatus capable of minimizing thickness and improving cooling efficiency, and also electronic equipment mounting the same.

In particular, this invention provides a cooling apparatus that is able to improve cooling efficiency by disposing a heat transporting body such as a heat pipe at an optimum position, without increasing a radiator plate, and provides electronic equipment mounting the same.

A cooling apparatus in accordance with the present invention includes: a fan having axial-flow blades and centrifugal blades; a case containing the fan rotatably, and having an inlet port for permitting air to enter in an axial direction of rotation from outside by a rotary action of the axial-flow blades under the rotation of the fan, a first outlet port, which is disposed opposite to the inlet port, for permitting the air entered through the inlet port to exit to the outside in the axial direction, and a second outlet port for permitting the air entered through the inlet port to exit to the outside in the centrifugal direction under a rotary action of centrifugal blades; and a driving part for driving the fan to rotate.

In this invention it is arranged to permit the air entered through the inlet port to exit directly through the first outlet port to the outside of the case in the axial direction under the rotation of the axial-flow blades, and permit the air entered through the inlet port to exit through the second outlet port to the outside of the case in the centrifugal direction under the rotation of the centrifugal blades. Therefore, the amount of flow of air exiting from the inside of the case can be increased than has hitherto been possible. This enables to increase the amount of heat dissipation and improve cooling efficiency. In addition, the cooling apparatus can be minimized in thickness because there is no need to enlarge a radiator plate and increase the number thereof, on the basis of an increase in the heating value due to a heat-generating element.

According to one embodiment of the present invention, there is further provided a radiator plate disposed at least at one of the first outlet port and the second outlet port. This enables to further improve cooling efficiency. In this invention, the radiator plate may be minimized so as to have a size of meeting the heating value of a heat-generating element, for example. Alternatively, there may be provided a radiator plate disposed integrally with the first outlet port and the second outlet port. Other embodiments of the present invention are similar to this. In the case of disposing a radiator plate on both of the first outlet port and the second outlet port, the heat dissipation area can be increased than would hitherto been possible, thereby increasing cooling efficiency.

According to other embodiment of the present invention, there is further provided a heat transporting body which has an endothermic part for absorbing heat by vaporizing working fluid and a radiating part for dissipating heat by condensing the working fluid, and in which the radiating part is disposed so as to make contact with the radiator plate. Thereby, cooling efficiency can be further improved than the case of disposing only the radiator plate. The heat transporting body may be one having the function of so-called heat pipe, and the shape of the heat transporting body is not limited to, for example, a general pipe shape, it may be of a plate shape, for example.

According to other embodiment of the present invention, the case is of a rectangular parallelopiped shape, and the second outlet port has a first side surface outlet port disposed at a first side surface of the case and a second side surface outlet port disposed at a second side surface, which is substantially orthogonal to the first side surface, and there is further provided a first radiator plate disposed at the first side surface outlet port and a second radiator plate disposed at the second side surface outlet port. In the present invention, the two outlet ports are disposed in the centrifugal direction, and the radiator plates are disposed at the two outlet ports, respectively, thereby enabling to further increase cooling efficiency.

According to other embodiment of the present invention, there is further provided a third radiator plate disposed integrally with the first or the second radiator plate. The term "integrally" as used here denotes that the second radiator plate and the third radiator plate are physically connected to each other. Alternatively, the first or second radiator plate and the third radiator plate may be formed integrally.

According to other embodiment of the present invention, the second radiator plate is formed to have a smaller surface area than that of the first radiator plate, and there is further provided a heat transporting body which has an endothermic part for absorbing heat by vaporizing working fluid and a radiating part for dissipating heat by condensing the working fluid, and the heat transporting body is disposed such that the radiating part contacts with the radiator plate, and a portion closer to the endothermic part than the radiating part is disposed so as to make contact with the second radiator plate. In this invention, the portion on closer to the endothermic part than the radiating part denotes any portion between the radiating part and the endothermic part. In this invention, the radiator plates having different surface areas are disposed in response to the heat dissipation amount that will vary depending on portions of the heat transporting body. This enables to optimize cooling efficiency. Especially in this invention, it is constructed such that the surface area of the second radiator plate making contact with the endothermic part side is smaller than the surface area of the first radiator plate making contact with the radiating part side. This enables to increase cooling efficiency, while minimizing the size of the second radiator plate.

Electronic equipment in accordance with the present invention mounts a cooling apparatus includes: a fan having axial-flow blades and centrifugal blades; a case containing the fan rotatably, and having an inlet port for permitting air to enter in an axial direction from outside by a rotary action of the axial-flow blades under rotation of the fan, a first outlet port, which is disposed opposite to the inlet port, for permitting the air entered through the inlet port to exit to the outside in the axial direction, and a second outlet port for permitting the air entered through the inlet port to exit to the outside in the centrifugal direction under the rotary action of the centrifugal blades; and a driving part to drive the fan to rotate.

In this invention, the amount of flow of air exiting from the inside of the case can be increased than has hitherto been possible. This enables to increase the amount of heat dissipation and improve cooling efficiency. In addition, the cooling apparatus can be minimized in thickness because there is no need to enlarge the radiator plate and increase the number thereof, on the basis of an increase in the heating value due to a heat-generating element. This also enables to minimize the size or the thickness of electronic equipment.

Thus, in accordance with the present invention, it is able to minimize the thickness of the cooling apparatus and also increase cooling efficiency thereof. In particular, cooling efficiency can be increased, without increasing the size of radiator plate and the heat transporting body such as a heat pipe can be arranged at an optimum position.

DESCRIPTION OF THE PREFERRED EMBODIMENT(S)

Figure 1:
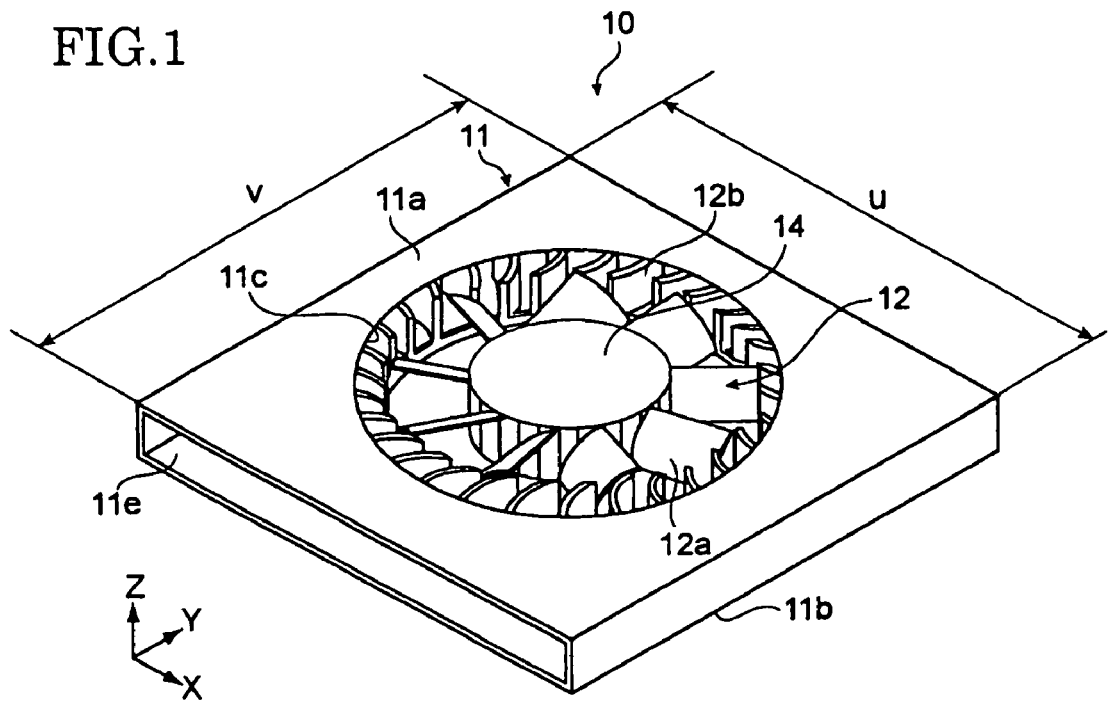
FIG. 1 is a perspective view showing a cooling apparatus according to the first embodiment of the present invention.

Hereinafter, embodiments of the present invention will be described by referring to the drawings.

FIG. 1 is a perspective view showing a cooling apparatus in accordance with a first embodiment of the present invention.

Figure 2:
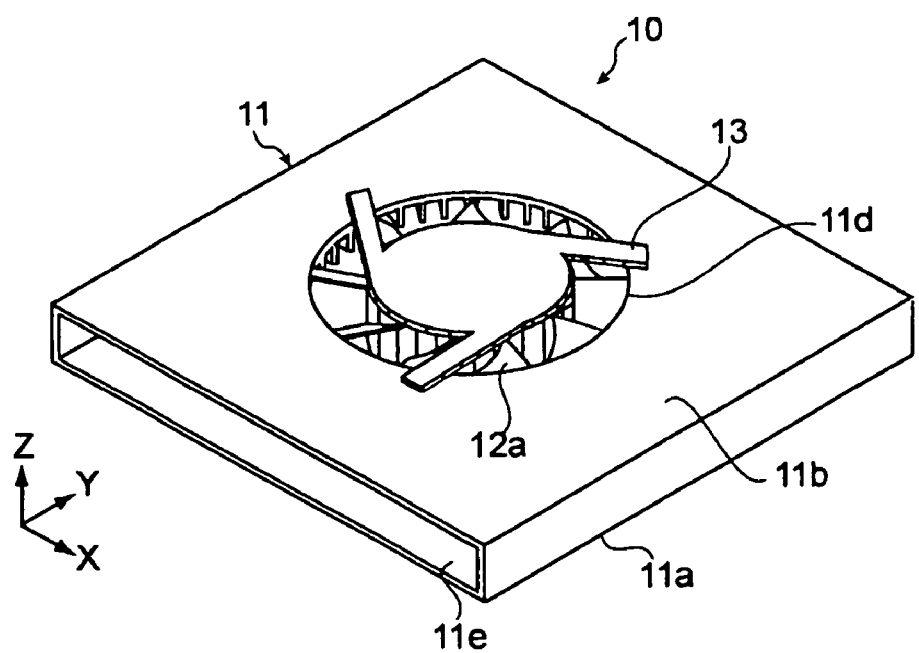
FIG. 2 is a perspective view of the rear surface side of the cooling apparatus shown in FIG. 1.
Figure 3:
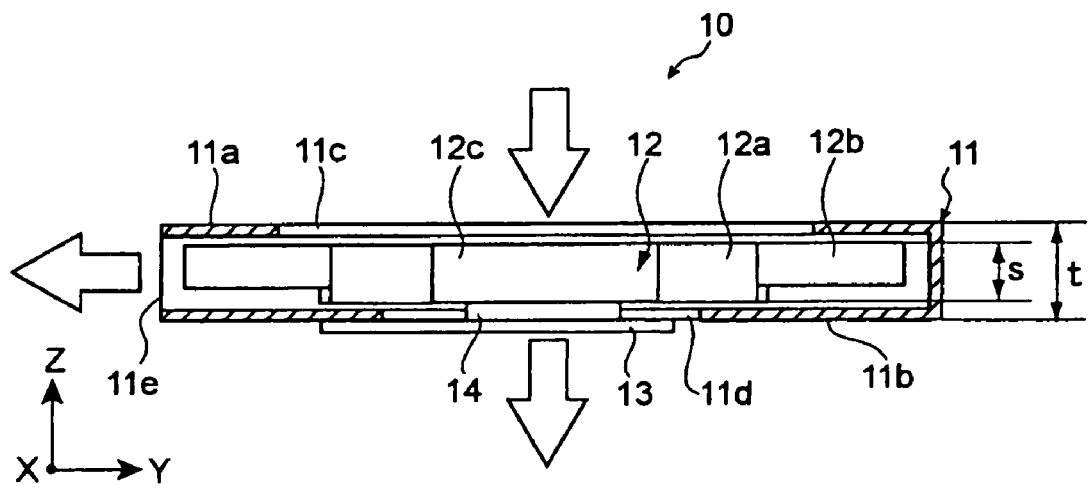
FIG. 3 is a sectional view showing the cooling apparatus shown in FIG. 1.

FIG. 2 is a perspective view of the rear surface side of the cooling apparatus. FIG. 3 is a sectional view showing the cooling apparatus.

A cooling apparatus 10 is constructed with a fan 12 contained within a case 11. An air inlet port 11c is opened in a surface 11a of the case 11, and a first outlet port 11d is opened in a rear surface 11b. Further, a side surface outlet port 11e as a second outlet port is opened in a side surface of the case 11.

Figure 4:
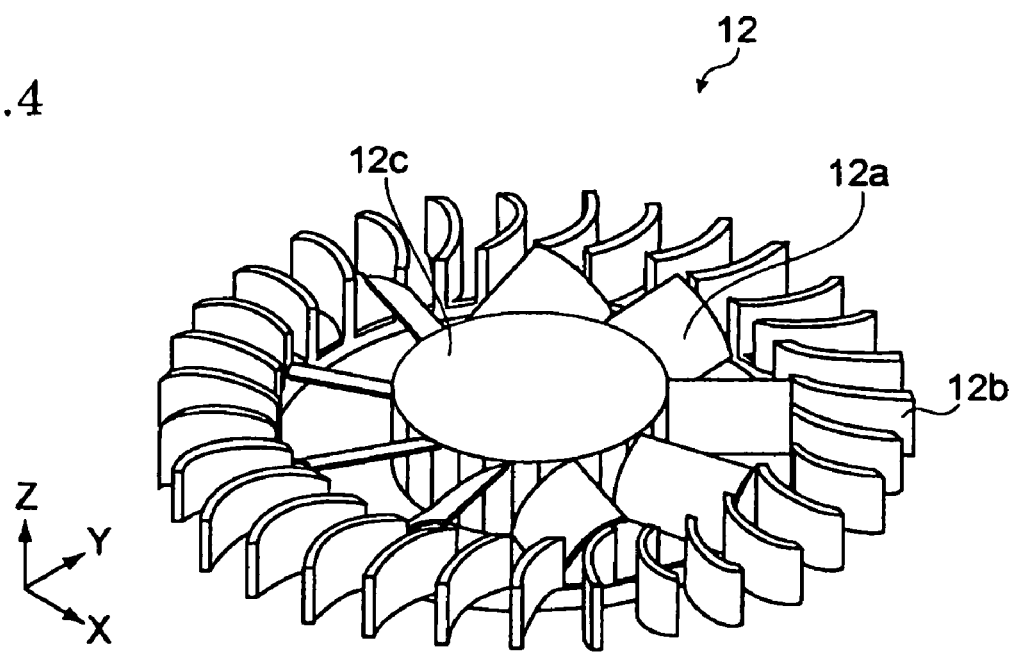
FIG. 4 is a perspective view of a fan shown in FIG. 1.

As shown in FIG. 4, the fan 12 is constituted by an axial body 12c, a plurality of axial-flow blades 12a formed around the axial body 12c, and centrifugal blades 12b formed around these axial-flow blades 12a. The axial body 12c contains a motor as a driving part. The motor has a stator 14, a rotator, a coil, a magnet, a bearing, and the like (not shown). The stator 14 is fixed to a fixing member 13 shown in FIG. 2, and the fixing member 13 is attached to the rear surface 11b of the case 11 so that the fan 12 is rotatably contained within the case 11. The axial direction of rotation of the fan 12 is the Z direction, and the centrifugal direction is the X direction and the Y direction in FIG. 1 to FIG. 4.

As shown in FIG. 1, the longitudinal and lateral lengths "u" and "v" of the case 11 are, for example, 60 mm and 60 mm, respectively. As shown in FIG. 3, the thickness "s" of the fan 12 is, for example, 4 mm to 6 mm. The height "t" of the case 11 is, for example, 8 mm to 10 mm.

The operation of the cooling apparatus 10 so constructed will be described. When the power is applied to the fan 12, it rotates at a predetermined speed, for example. Under the rotation of the fan 12, the action of the axial-flow blades 12a permits air to enter the inside through the inlet port 11c from the outside of the case 11, and permits the air to directly exit through the first outlet port 11d in the Z-axis direction (the axial-flow direction). In addition, under the rotation of the fan 12, the action of the centrifugal blades 12b permits the air entered through the aforesaid inlet port 11c to exit through the side surface outlet port 11e in the Y direction (the centrifugal direction).

Thus, in the embodiment, the rotation of the axial-flow blades 12*a* permits the air entered through the inlet port 11*c* to exit directly in the axial direction to the outside of the case 11, and the rotation of the centrifugal blades 12*b* permits the air entered through the inlet port 11*c* to exit through the side surface outlet port 11*e* in the centrifugal direction to the outside of the case 11. Thereby, the amount of flow of air exiting from the inside of the case 11 can be increased than has hitherto been possible. This enables to increase the amount of heat dissipation and improve cooling efficiency. Especially in this embodiment, although the opening area of the side surface outlet port 11*e* is smaller than that of the conventional case, by minimizing the thickness of the fan 12 and the case 11, it is able to secure the heat dissipation area by enlarging the case 11 in the centrifugal direction to increase the opening area of the first outlet port 11*d*. In other words, even if the case 11 is thinned, the first outlet port 11*d* can perform more heat dissipation, it is therefore able to improve cooling efficiency, while achieving a small thickness.

In addition, the cooling apparatus 10 can be minimized in thickness because there is no need to enlarge the radiator plate and increase the number thereof, on the basis of an increase in the heating value due to a heat-generating element (not shown).

Figure 5:
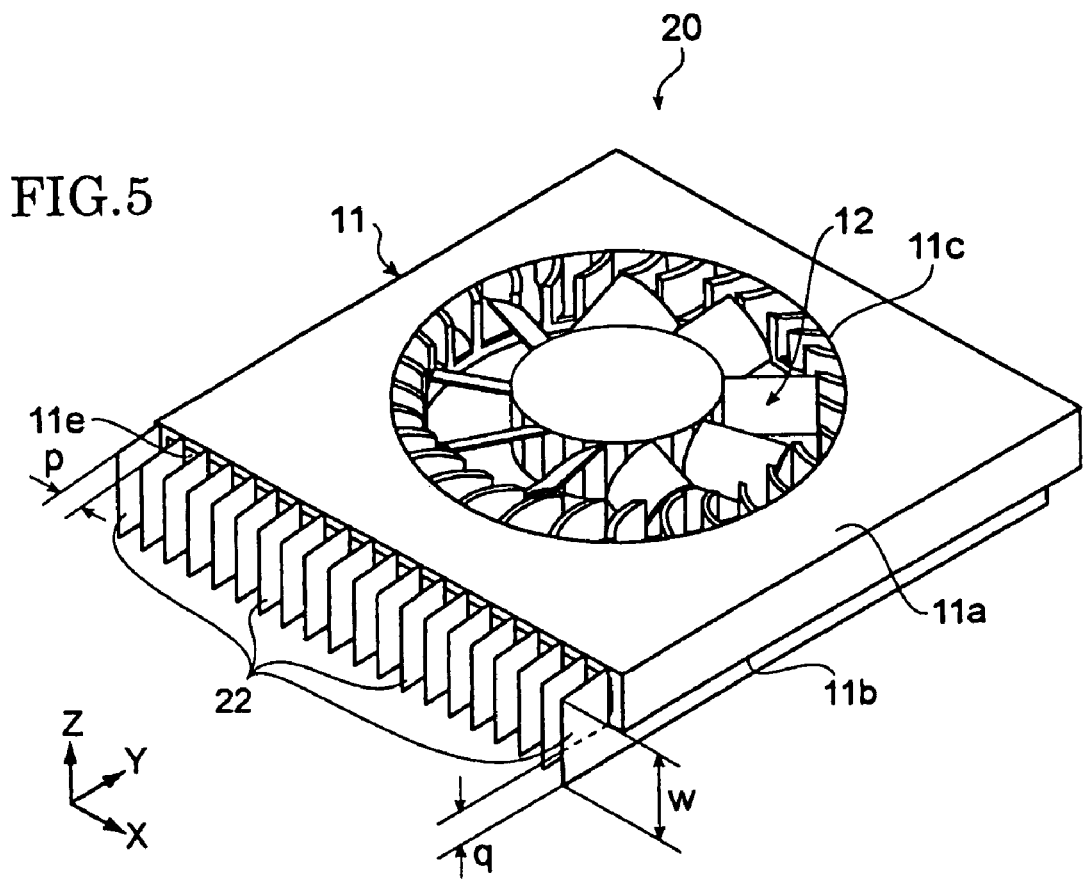
FIG. 5 is a perspective view showing a cooling apparatus according to the second embodiment of the present invention.
Figure 6:
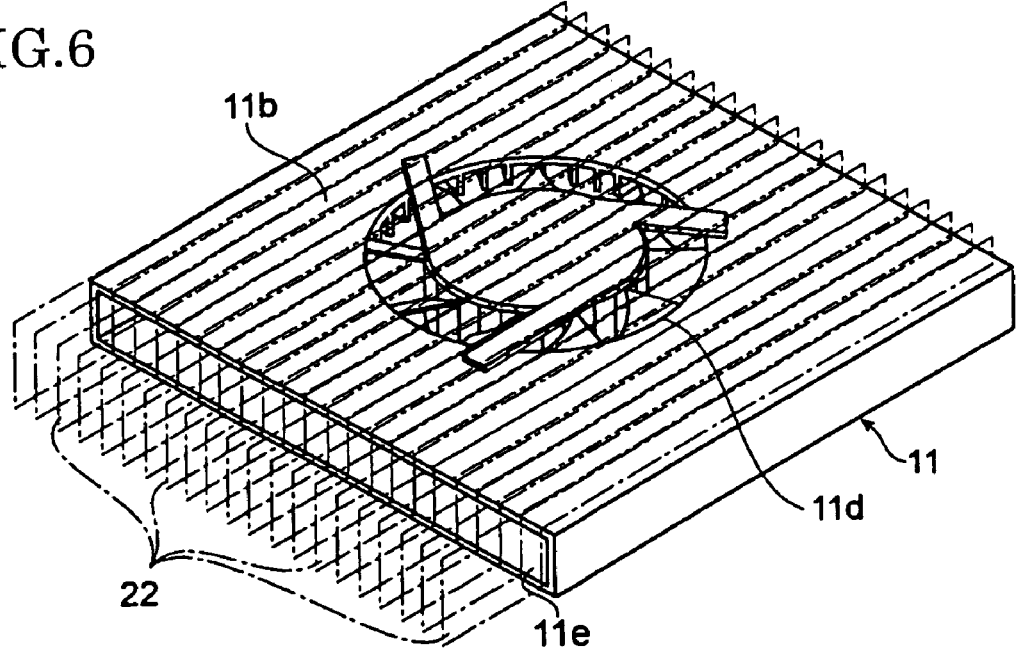
FIG. 6 is a perspective view of the rear surface side of the cooling apparatus shown in FIG. 5.

FIG. 5 is a perspective view showing a cooling apparatus in accordance with a second embodiment of the present invention. FIG. 6 is a perspective view of the rear surface side thereof.

A cooling apparatus 20 of this embodiment is constructed by attaching fins 22 composed of metal such as copper and aluminum to the cooling apparatus 10 in accordance with the first embodiment. The radiating fins 22 are disposed so as to extend through a side surface outlet port 11*e* to a rear surface 11*b*. Thereby, it is arranged to release the heat of air exiting through the side surface outlet port 11*e* of a case 11, and also release the heat of air exiting through a first outlet port 11*d*.

In FIG. 5 and FIG. 6, although the radiating fins 22 are disposed integrally with the side surface outlet port 11*e* and the first outlet port 11*d*, a fin member may be disposed physically separately (with use of two members) between the side outlet port 11*e* and the first outlet port 11*d*. The term "integrally" as used here indicates the case of being connected physically, or the case of being formed integrally.

In FIG. 5, the height "w" of the radiating fins 22 is, for example, 10 mm to 12 mm. The pitch "p" of the fins 22 is 2 mm, for example. The height "q" of the radiating fins 22 from the rear surface 11*b* of the case 11 is 5 mm, for example.

In accordance with this embodiment, the radiating fins 22 are disposed at the first outlet port 11*d* and the side surface outlet port 11*e*, respectively, it is able to further increase cooling efficiency than the cooling apparatus 10 in accordance with the foregoing first embodiment. In particular, although the two outlet ports are disposed in the centrifugal direction and respective fins 22 are disposed at these outlet ports in the conventional fan unit, the radiating fins 22 are disposed throughout the entire rear surface 11*b* of the case 11 in this embodiment, thereby obtaining the heat dissipation area not less than two times greater than the aforesaid conventional fan unit.

Figure 7:
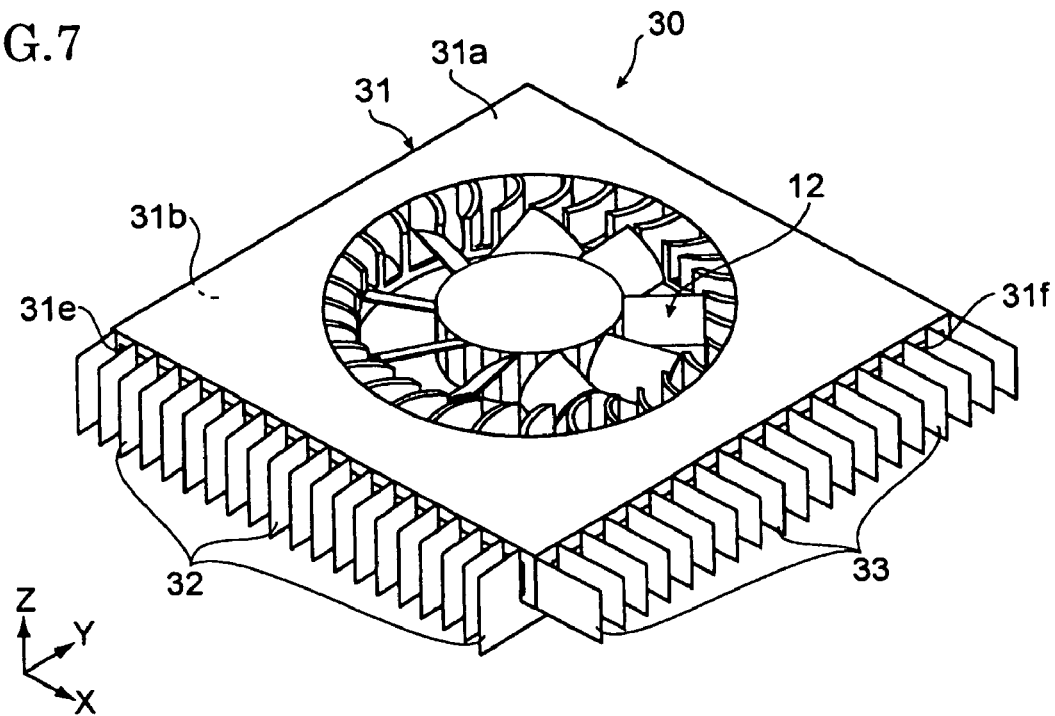
FIG. 7 is a perspective view showing a cooling apparatus according to the third embodiment of the present invention.

FIG. 7 is a perspective view showing a cooling apparatus in accordance with a third embodiment of the present invention. A case 31 of a cooling apparatus 30 of this embodiment has at a side surface thereof a first side surface outlet port 31*e* and a second side surface outlet port 31*f*. First radiating fins 32 and second radiating fins 33 are disposed at these outlet ports 31*e* and 31*f*, respectively. As the first radiating fins 32, there are used, for example, similar to the radiating fins 22 shown in FIG. 5. On the other hand, the second radiating fins 33 are not disposed on the rear surface 31*b* side, but disposed only on the side surface. Further, like the foregoing first and second embodiments, an outlet port (not shown) is also disposed on the rear surface 31*b* side of the case 31.

Figure 8:
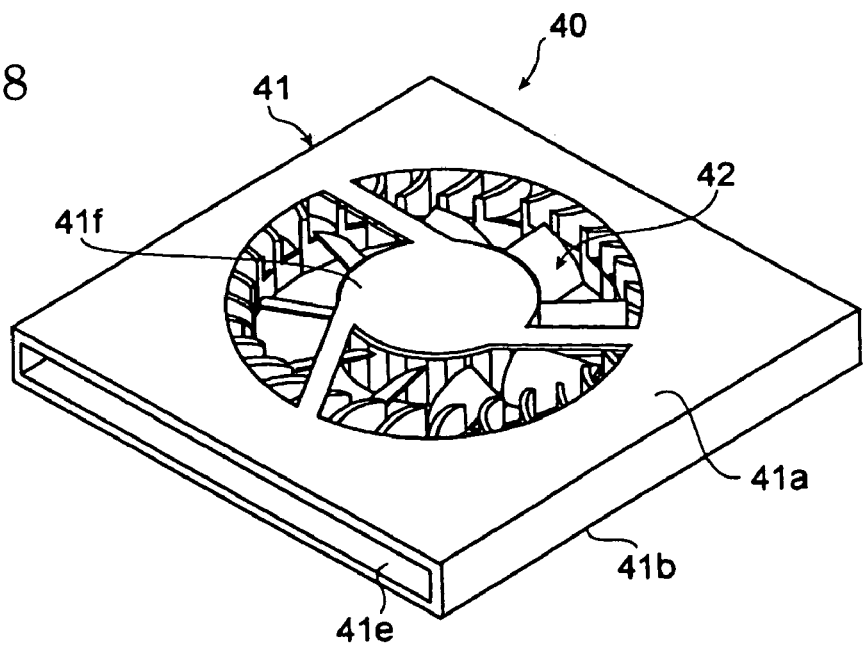
FIG. 8 is a perspective view showing a cooling apparatus according to the fourth embodiment of the present invention.
Figure 9:
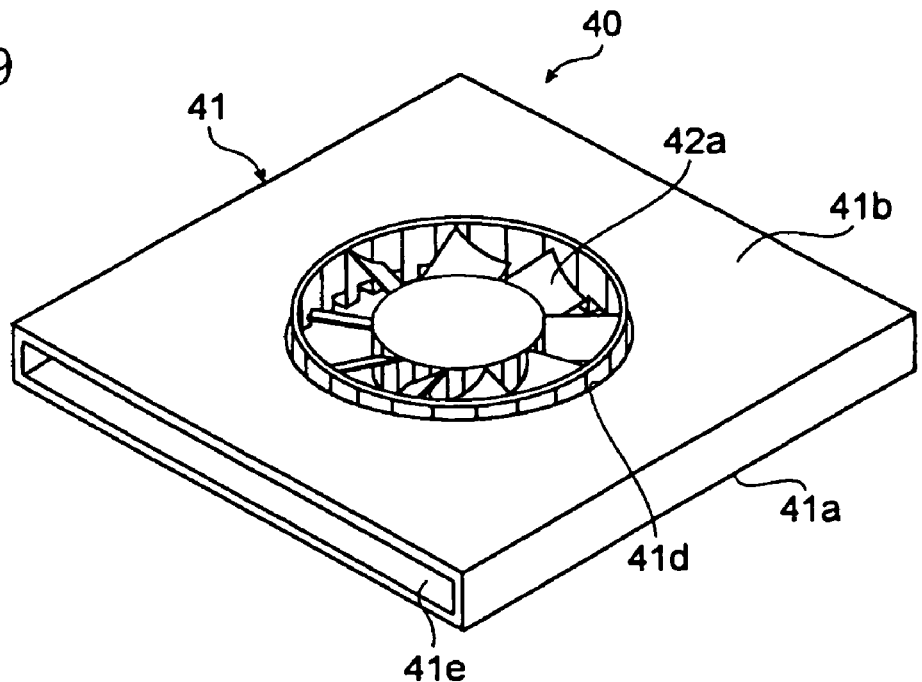
FIG. 9 is a perspective view of the rear surface side of the cooling device shown in FIG. 8.
Figure 10:
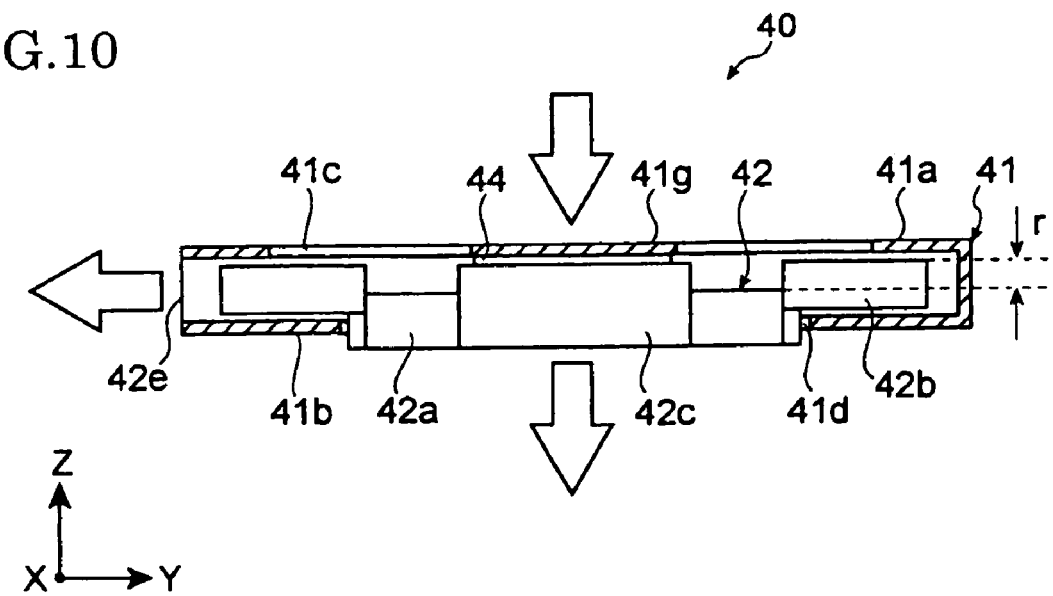
FIG. 10 is a sectional view of the cooling apparatus shown in FIG. 8.

In this embodiment it is arranged to permit air to exit from the case 31 in the axial direction, and permit air to exit from the case 31 in two directions, the X direction and the Y direction, in the centrifugal direction. This enables to further increase the heat dissipation area thereby to further increase cooling efficiency. FIG. 8 is a perspective view showing a cooling apparatus in accordance with a fourth embodiment of the present invention. FIG. 9 is a perspective view of the rear surface side of this cooling apparatus, and FIG. 10 is a sectional view thereof.

Figure 11:
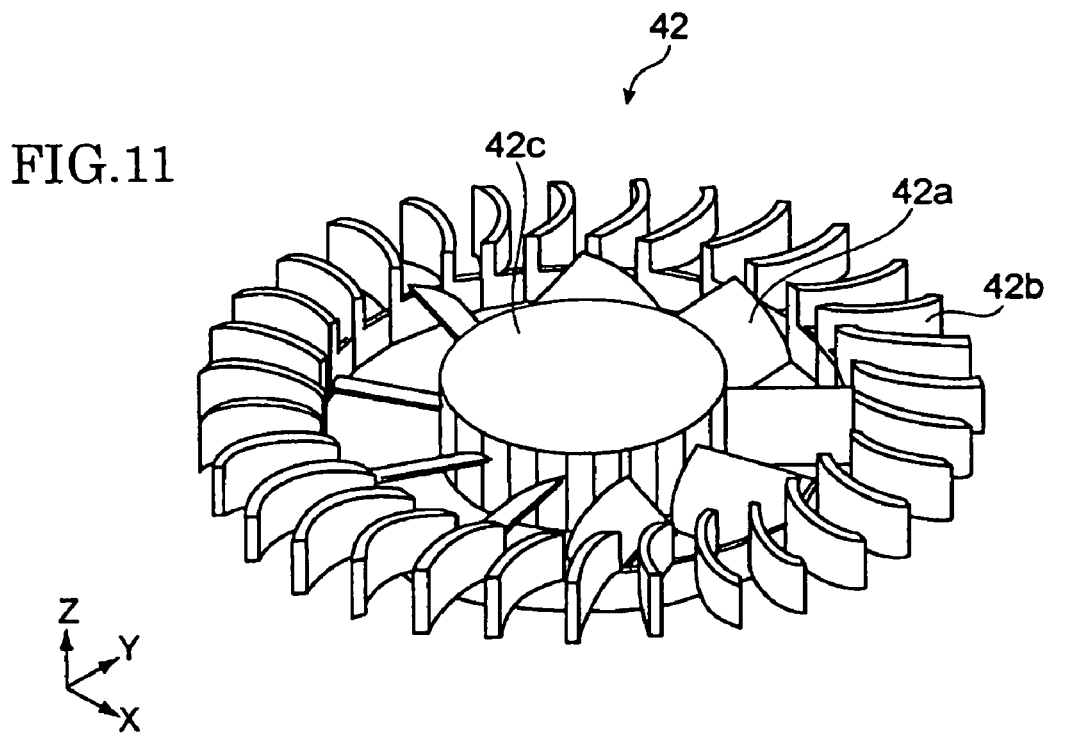
FIG. 11 is a perspective view of a fan shown in FIG. 8.

A cooling apparatus 40 in accordance with this embodiment has within a case 41 a fan 42 that is different in shape and the like, in place of the fan 12 in accordance with the foregoing first, second and third embodiments. As shown in FIG. 8 and FIG. 10, a fitting part 41*f* of the fan 42 is disposed at a surface 41*a* of the case 41, and, for example, a stator 44 of a motor of the fan 42 is attached to the fitting part 41*f* so as to contain the fan 42 within the case 41. The fan 42 has an axial-flow blade 42*a*, a centrifugal blade 42*b*, and an axial body 42*c*. As shown in FIG. 10 and FIG. 11, the axial-flow blade 42*a* is arranged at a position that is offset axially (the Z direction) than the position of the axial-flow blade 12*a* of the aforesaid fan 12 (see FIG. 3 and the like). This offset value "r" is, for example, 1 mm to 5 mm. The amount of air axially entering and exiting can be adjusted to a desired amount by designing while changing the offset value so suitably. In the case of this embodiment, offsetting in this manner enables to increase the amount of flow of the axial air, thereby enabling to efficiently perform cooling processing.

The direction of the offset is not limited to the axial direction toward the rear surface 41*b* side of the case 41 as in this embodiment, but it may be the axial direction toward the surface 41*a* side.

Figure 12:
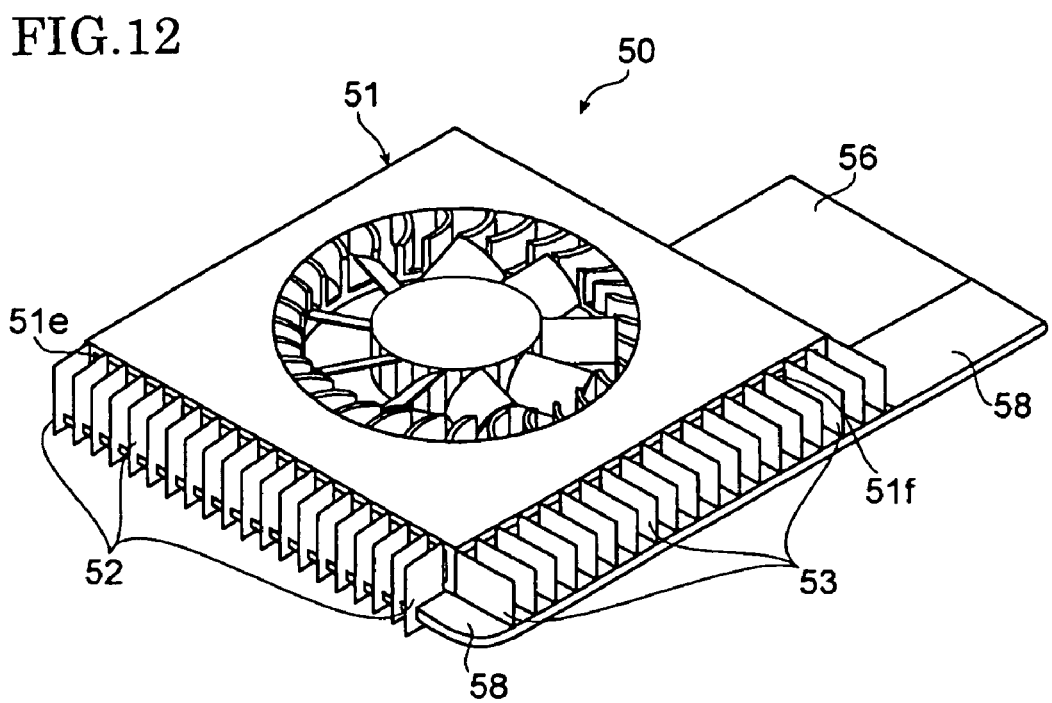
FIG. 12 is a perspective view showing a cooling apparatus according to the fifth embodiment of the present invention.
Figure 13:
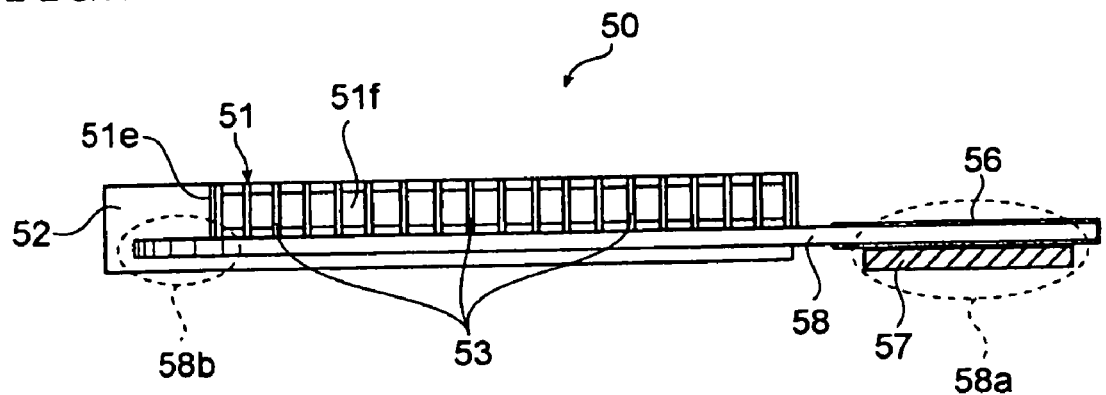
FIG. 13 is a side view of the cooling apparatus shown in FIG. 12.

FIG. 12 is a perspective view showing a cooling apparatus 50 in accordance with a fifth embodiment of the present invention, and FIG. 13 is a side view thereof.

The cooling apparatus 50 of this embodiment is obtained by adding elements such as a heat pipe 58, a heat spreader 56 to the cooling apparatus 30 in accordance with the foregoing third embodiment (see FIG. 7). A heat-generating element 57 is attached so as to contact the rear side of the heat spreader 56, and the heat spreader 56 is attached so as to contact with the vicinity of an endothermic part 58*a* of the heat pipe 58. Thereby, it is arranged that the heat generated from the heat-generating element 57 is diffused at the heat spreader 56 and the heat pipe 58 absorbs and releases the diffused heat.

The heat pipe 58 is of substantially an L shape, for example, and disposed so as to make contact with first radiating fins 52 disposed at a first side surface outlet port 51*e* and second radiating fins 53 disposed at a second side surface outlet port 51*f*. More specifically, a radiating part 58*b* of the heat pipe 58 makes contact with the first radiating fins 52, and the side closer to the endothermic part 58*a* of the heat pipe 58 than the radiating part 58*b*, namely a portion between the radiating part 58*b* and the endothermic part 58*a* makes contact with the second radiating fins 53. Especially, in this embodiment it is constructed such that the surface areas of the second radiating fins 53 in contact with the endothermic part 58*a* side is smaller than the surface areas of the first radiating fins 52 in contact with the endothermic part 58*b* side. The amount of heat dissipation is the maximum at the radiating part 58*b* of the heat pipe 58, and the amount of heat dissipation is decreased toward the endothermic part 58a side, whereas the amount of endothermic is increased. Thus, the sizes of the radiating fins 52 and 53 are made different from each other in response to the amount of heat dissipation that differs depending on portions of the heat pipe 58. This enables to increase cooling efficiency, while achieving the miniaturization by minimizing the size of the second radiating fins 53.

Thus, in this embodiment the radiator plates having different surface areas are disposed in response to the amount of heat dissipation that differs depending on portions of the heat pipe 58. Therefore, without limiting to having the surface areas of the radiating fins 52 and 53 shown in FIG. 12 and FIG. 13 be different from each other, the size of the surface area of the radiating fins may be varied gradually or stepwise, depending on the portion of the heat pipe 58.

Figure 14:
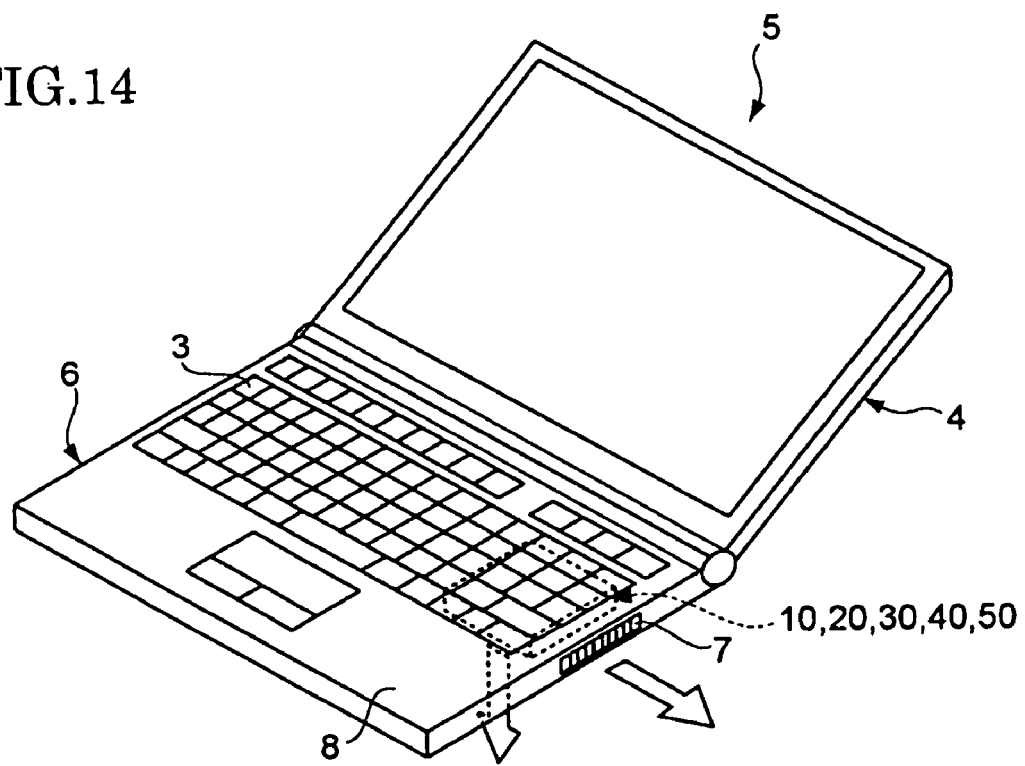
FIG. 14 is a perspective view showing a laptop type computer mounting a cooling apparatus according to the each embodiment.

FIG. 14 is a perspective view showing a laptop computer as an example of electronic equipment mounting the foregoing cooling apparatus 10, 20, 30, 40, or 50. A computer 5 is constituted by, for example, a liquid crystal monitor part 4 and a body part 6. For example, a keyboard unit 3 and the like are disposed at the body part 6. An opening 7 is formed in a side surface of a casing 8 of the body part 6. The cooling apparatus 10 (or 20, 30, 40, 50) is disposed, for example, under the keyboard unit 3, and is arranged such that the opening 7 is opposed to the outlet port 11e of the side surface of the cooling apparatus 10 (or the second side surface outlet port 31f, 51f, and the like). An opening (not shown) is also formed on the bottom surface side of the casing 8, and the cooling apparatus 10 (or 20, 30, 40, 50) is arranged such that the opening on that bottom surface is opposed to the outlet port 11d (or 41d or the like) on the rear surface side of the case. By arranging so, the heat within the casing 8, or the heat generated from the heat-generating element and the like contained in the cashing 8 can be released from the bottom surface and the side surface of the casing 8, thus enabling to efficiently perform cooling processing.

Figure 15:
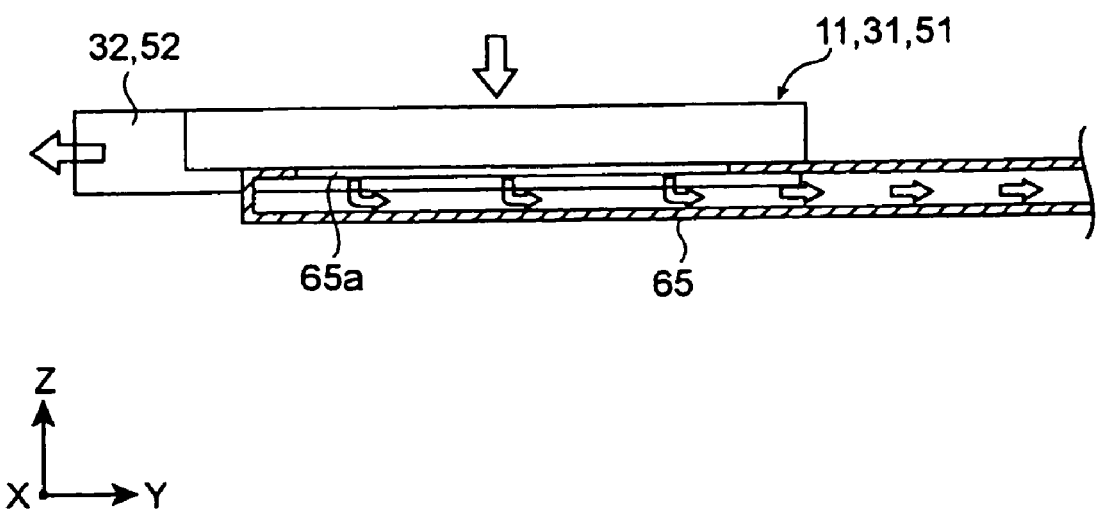
FIG. 15 is a sectional view showing a form that a cover member is provided on the rear surface side of a case.

In addition, depending on the form of the computer 5, there may be disposed on the rear surface 11b side of the case 11 or the like, as shown in FIG. 15, a cover member 65 that permits the escape of the air exiting through the outlet port 11d along the longitudinal direction of the radiating fins 32 and 52 (for example, the Y direction in the figure). The cover member 65 has an opening part 65a, and the air exiting through the outlet port 11d on the rear surface may be taken into the cover member 65 via the opening part 65a. By this construction, if an opening is formed only at the side surface of the cashing 8 of the computer 5, it is able to have air to exit toward the opening at the side surface. The cooling apparatus can be arranged suitably in response to the computers having different forms.

The present invention is not limited to the foregoing embodiments, but various modifications can be made.

For example, although in the respective embodiments the shapes of the case 11, 31, 41, and 51 are substantially rectangular parallelopiped shape, that is, a rectangular shape when viewed from the axial direction of the fan, they may be polygon or round when viewed from the axial direction. Further, the number of the outlet port 11e and the like at the side surface of the case 11 and the like may be three or more.

Additionally, the orientation in the longitudinal direction of the radiating fins 22, 32, 33, 52, and 53 is not limited to the foregoing respective embodiments, but they can be arranged in an optimum orientation to the shape of the case.

In an alternative, all of the radiating fins 32 and 33 may be formed integrally by disposing the radiating fins 33 shown in FIG. 7 so as to extend to the rear surface 31b side of the case 31. In addition, the case and the radiating fins may be integral with each other in the foregoing respective embodiments.

Additionally, the heat pipe 58 is not limited to the forms shown in FIG. 12 and FIG. 13. For example, a heat transporting body as a heat pipe may be disposed so as to cover substantially the entire surface of the rear surface side of the case 51. The heat transporting body in this case may be a flat plate shape. Further, this case may employ the construction of combining this heat transporting body and the cooling apparatus shown in FIG. 15. In other words, part or all of the heat transporting body covering substantially the entire surface of the rear surface side of the case can be arranged in the inside of the cover member 65 to the extent that air can exit in the cover member 65.

Furthermore, although the laptop computer is taken as example of electronic equipment, without limiting to this, it may be a digital camera, a digital video camera, or other personal digital assistance (PDA). In addition, without limiting to PDAs, it may be desktop equipment.

What is claimed is:

1. A cooling apparatus comprising:
a fan having axial-flow blades and centrifugal blades;
a case containing said fan rotatably, and having an inlet port for permitting air to enter in an axial direction of rotation from outside by a rotary action of said axial-flow blades under rotation of said fan, a first outlet port, which is disposed opposite to said inlet port, for permitting air entered through said inlet port to exit to said outside in said axial direction, and a second outlet port for permitting air entered through said inlet port to exit to said outside in a centrifugal direction under a rotary action of said centrifugal blades;
a driving part for driving said fan to rotate; and
a radiator structure provided at at least one of said first outlet port or said second outlet port, and further wherein a heat pipe is in contact with at least a portion of the radiator structure and wherein the radiator structure is comprised of at least a plurality of fins each having a particular surface area, the surface area of the individual fins varying across different portions of the heat pipe structure.

2. Electronic equipment having a cooling apparatus:
wherein said cooling apparatus is comprised of:
a fan having axial-flow blades and centrifugal blades;
a case containing said fan rotatably, and having an inlet port for permitting air to enter in an axial direction of rotation from outside by a rotary action of said axial-flow blades under rotation of said fan, a first outlet port, which is disposed opposite to said inlet port, for permitting air entered through said inlet port to exit to said outside in said axial direction, and a second outlet port for permitting air entered through said inlet port to exit to said outside in a centrifugal direction under a rotary action of said centrifugal blades;
a driving part for driving said fan to rotate; and
a radiator structure provided at at least one of said first outlet port or said second outlet port, and further wherein a heat pipe is in contact with at least a portion of the radiator structure and wherein the radiator structure is comprised of at least a plurality of fins each having a particular surface area, the surface area of the individual fins varying across different portions of the heat pipe structure.

3. The cooling apparatus according to claim 1, wherein at least a portion of said radiator structure extends from its respective outlet port across the case and at least substantially to a side of the case opposing the respective outlet port.

4. The cooling apparatus according to claim 3, wherein said portion of the radiator structure extending from its respective outlet port across the case and at least substantially to a side of the case opposing the respective outlet port are a subset of the plurality of fins having a larger surface area compared to the remaining fins.

5. The cooling apparatus according to claim 3, wherein the portion of the radiator structure which extends across the case from the respective outlet port to the opposing side surface protrudes either above an upper surface of the case or below a lower surface of the case.

6. The cooling apparatus according to claim 3, wherein the portion of the radiator structure which extends across the case from the respective side surface outlet port to the opposing side surface surrounds at least three sides of the heat pipe in the area immediately outside the respective outlet port.

7. The electronic equipment having a cooling apparatus according to claim 2, wherein at least a portion of said radiator structure extends from its respective outlet port across the case and at least substantially to a side of the case opposing the respective outlet port.

8. The electronic equipment having a cooling apparatus according to claim 7, wherein said portion of the radiator structure extending from its respective outlet port across the case and at least substantially to a side of the case opposing the respective outlet port are a subset of the plurality of fins having a larger surface area compared to the remaining fins.

9. The electronic equipment having a cooling apparatus according to claim 7, wherein the portion of the radiator structure which extends across the case from the respective outlet port to the opposing side surface protrudes either above an upper surface of the case or below a lower surface of the case.

10. The electronic equipment having a cooling apparatus according to claim 7, wherein the portion of the radiator structure which extends across the case from the respective side surface outlet port to the opposing side surface surrounds at least three sides of the heat pipe in the area immediately outside the respective outlet port.

* * * * *